United States Patent
Tagami et al.

(10) Patent No.: US 8,263,308 B2
(45) Date of Patent: Sep. 11, 2012

(54) POLYIMIDE SILICONE, PHOTOSENSITIVE RESIN COMPOSITION CONTAINING THE NOVEL POLYIMIDE SILICONE, AND METHOD FOR PATTERN FORMATION

(75) Inventors: Shohei Tagami, Annaka (JP); Takanobu Takeda, Joetsu (JP); Michihiro Sugo, Annaka (JP); Hideto Kato, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 286 days.

(21) Appl. No.: 12/722,068

(22) Filed: Mar. 11, 2010

(65) Prior Publication Data

US 2010/0233619 A1 Sep. 16, 2010

(30) Foreign Application Priority Data

Mar. 12, 2009 (JP) ................................ 2009-058944

(51) Int. Cl.
*G03F 7/004* (2006.01)
*G03F 7/30* (2006.01)
*C08G 69/26* (2006.01)
*C08G 77/00* (2006.01)

(52) U.S. Cl. ............... 430/270.1; 430/326; 430/330; 430/906; 525/436; 528/353

(58) Field of Classification Search ............ 430/270.1, 430/326, 330, 906; 525/436; 528/41, 353
See application file for complete search history.

(56) References Cited

U.S. PATENT DOCUMENTS

| | | | |
|---|---|---|---|
| 3,957,512 A | 5/1976 | Kleeberg et al. | |
| 4,243,743 A | 1/1981 | Hiramoto et al. | |
| 4,339,521 A * | 7/1982 | Ahne et al. | 430/192 |
| 4,395,482 A | 7/1983 | Ahne et al. | |
| 4,973,645 A | 11/1990 | Lee | |
| 5,114,826 A * | 5/1992 | Kwong et al. | 430/192 |
| 5,241,041 A * | 8/1993 | Choi et al. | 528/353 |
| 5,288,588 A | 2/1994 | Yukawa et al. | |
| 6,001,534 A | 12/1999 | Kato | |
| 6,605,353 B2 | 8/2003 | Okada et al. | |
| 7,781,541 B2 * | 8/2010 | Sugo et al. | 525/476 |
| 7,851,121 B2 * | 12/2010 | Yamanaka et al. | 430/191 |
| 8,071,273 B2 * | 12/2011 | Sakayori | 430/280.1 |
| 2009/0176172 A1 * | 7/2009 | Yamanaka et al. | 430/270.1 |

FOREIGN PATENT DOCUMENTS

| | | |
|---|---|---|
| EP | 1 842 870 A2 | 10/2007 |
| JP | 49-115541 A | 11/1974 |
| JP | 54-145794 A | 11/1979 |
| JP | 55-045746 A | 3/1980 |
| JP | 1-46862 B2 | 10/1989 |
| JP | 3-209478 A | 9/1991 |
| JP | 10-265571 A | 10/1998 |
| JP | 10-274850 A | 10/1998 |
| JP | 11-65107 A | 3/1999 |
| JP | 2001-335619 A | 12/2001 |
| JP | 2007-272072 A | 10/2007 |

OTHER PUBLICATIONS

Japanese Office Action dated Aug. 10, 2011, for Japanese Application No. 2009-058944.
EP 10 250 473; European Search Report; Jul. 13, 2010; pp. 1-4.

* cited by examiner

*Primary Examiner* — John Chu
(74) *Attorney, Agent, or Firm* — Birch, Stewart, Kolasch & Birch, LLP

(57) ABSTRACT

A polyimide silicone having in the molecule a phenolic hydroxy group in which a part or all of hydrogen atoms are substituted with an acid labile group is provided. The polyimide silicone comprises the unit represented by the formula (1):

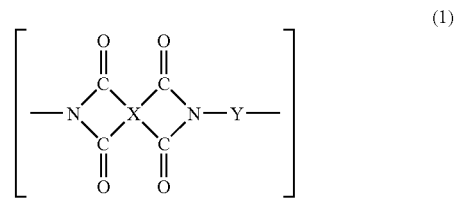

wherein X is a tetravalent group at least a part of which is a tetravalent organic group represented by the formula (2):

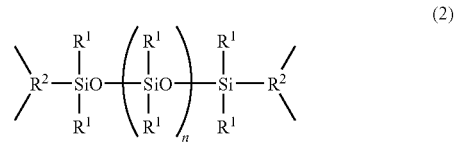

wherein $R^1$ is a monovalent hydrocarbon group, $R^2$ is a trivalent group, and n is an integer of 1 to 120 on average; and Y is a divalent organic group at least a part of which is a divalent organic group having a phenolic hydroxy group in which a part or all of hydrogen atoms are substituted with an acid labile group represented by the formula (3):

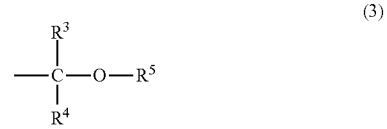

wherein $R^3$ and $R^4$ are a hydrogen atom or an alkyl group, and $R^5$ is an alkyl group, an aryl group, or an aralkyl group. $R^3$ and $R^4$, $R^3$ and $R^5$, or $R^4$ and $R^5$ may be bonded to each other to form a ring together with the carbon atom or the carbon atom and the oxygen atom to which they are bonded with the proviso that the $R^3$, $R^4$, and $R^5$ are independently an alkylene group.

10 Claims, No Drawings

POLYIMIDE SILICONE, PHOTOSENSITIVE RESIN COMPOSITION CONTAINING THE NOVEL POLYIMIDE SILICONE, AND METHOD FOR PATTERN FORMATION

CROSS-REFERENCE TO RELATED APPLICATION

This non-provisional application claims priority under 35 U.S.C. §119(a) on Patent Application No. 2009-058944 filed in Japan on Mar. 12, 2009, the entire contents of which are hereby incorporated by reference.

TECHNICAL FIELD

This invention relates to a novel polyimide silicone and a photosensitive resin composition containing such polyimide silicone. This invention also relates to a method for forming a pattern. The protective film prepared by using this composition for wiring and the like is particularly useful for applications such as insulative film for protecting a semiconductor element, an insulation film for wiring of a semiconductor element, an insulation film for multi-layer printed board, solder protective coating, cover lay film, and MEMS in view of its excellency in heat resistance, chemical resistance, electric insulation, and flexibility.

BACKGROUND ART

Various photosensitive polyimide materials have been proposed. Exemplary such materials include those using a polyamic acid as the precursor of the polyimide such as those of JP-A 49-115541 and JP-A 55-45746 using a polyamic acid having a photosensitive group introduced in the carboxyl group by ester bond, and the material of JP-A 54-145794 comprising a polyamic acid and an amine compound having a photosensitive group. For the formation of the desired polyimide film, these proposals, however, required imidation treatment at a high temperature in excess of 300° C. after the formation of the patterned film, and this led to the problem of limitation of the material that could be used for the substrate since the substrate had to endure the high temperature as well as the problem of the oxidation of the copper used for the interconnection.

One solution to these problems is found in JP-A 10-274850, JP-A 10-265571, and JP-A 2001-335619, which describe photosensitive polyimide materials comprising solvent-soluble resins which have been imidized for the purpose of lowering the curing temperature. Since the resins in these patent documents are rendered photosensitive by incorporating (meth)acrylic radicals, they are susceptible to oxygen interference due to their photo-curing mechanism and also susceptible to film slimming during the development. Accordingly, improvement of the resolution was difficult, and these materials were far from meeting all required properties.

Also proposed are positive compositions comprising a polyimide structure having phenolic hydroxyl radicals (JP-A 3-209478) or a polyamide structure (JP-B 1-46862 and JP-A 11-65107) combined with diazonaphthoquinone. These compositions suffer from the drawbacks that formation of a thick films in excess of 20 µm is difficult due to their light transmittance and that the inherent curability of the resin is not fully utilized because of the reduced molecular weight of the resin for ensuring effective development and increased amount of the diazonaphthoquinone (sensitizer) relative to the resin.

SUMMARY OF INVENTION

The present invention has been completed in view of the situation as described above, and an object of the present invention is to provide a polyimide silicone which enables easy formation of a fine pattern even at a film thickness in excess of 20 µm. The polyimide silicone is also capable of providing a film which is highly reliable as a protective film with excellent film properties when heat treated at a relatively low temperature of around 200° C. after the pattern formation. Another object of the present invention is to provide a photosensitive resin composition containing such polyimide silicone as well as a method for forming a pattern by using such composition.

The inventors of the present invention made an intensive study to realize the objects as described above, and found the usefulness of the polyimide silicone having a number average molecular weight of 5,000 to 200,000, which comprises the repeating unit represented by the following general formula (1) and has in the molecule a phenolic hydroxy group in which a part or all of hydrogen atoms are substituted with an acid labile group represented by the following general formula (3).

The inventors also found that the photosensitive resin composition comprising the polyimide silicone as described above and a photoacid generator which generates an acid by irradiation of a light beam having a wave length in the range of 240 to 450 nm, and optionally, a melamine compound, a glycoluril compound, a urea compound, an epoxy compound, or a compound containing at least two methylol derivatives in a molecule is capable of being exposed by a light beam having a wide range of wavelength at high sensitivity, readily forming a thick film having a thickness in excess of 20 µm with no oxygen interference, and forming a fine pattern by the pattern formation method as described below; and that the photocurable resin composition and the cured film obtained by a heat treatment after the pattern formation has excellent heat resistance as well as electric insulation. The present invention has been realized on the bases of such findings.

Accordingly, the present invention provides a polyimide silicone, a photosensitive resin composition, and a method for forming a pattern as described below.

[1] A polyimide silicone having a number average molecular weight of 5,000 to 200,000, which has in the molecule a phenolic hydroxy group in which a part or all of hydrogen atoms are substituted with an acid labile group, said polyimide silicone consisting of the repeating unit represented by the following general formula (1):

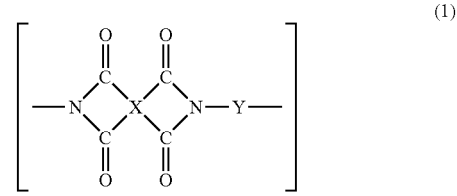

wherein X is a tetravalent group at least a part of which is a tetravalent organic group represented by the following general formula (2):

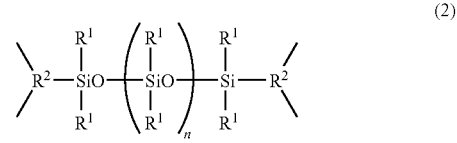

wherein $R^1$ is independently a monovalent hydrocarbon group of 1 to 8 carbon atoms, $R^2$ is independently a trivalent group, and n is an integer of 1 to 120 on average; and
Y is a divalent organic group at least a part of which is a divalent organic group having a phenolic hydroxy group in which a part or all of hydrogen atoms are substituted with an acid labile group represented by the following general formula (3):

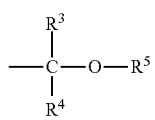

(3)

wherein $R^3$ and $R^4$ are independently a hydrogen atom or a straight, branched, or cyclic alkyl group of 1 to 6 carbon atoms, and $R^5$ is a straight, branched, or cyclic alkyl group of 1 to 30 carbon atoms, an aryl group of 6 to 20 carbon atoms, or an aralkyl group of 7 to 20 carbon atoms. $R^3$ and $R^4$, $R^3$ and $R^5$, or $R^4$ and $R^5$ may be bonded to each other to form a ring together with the carbon atom or the carbon atom and the oxygen atom to which they are bonded with the proviso that the $R^3$, $R^4$, and $R^5$ involved in the formation of the ring are independently a straight or branched alkylene group of 1 to 18 carbon atoms.

[2] A polyimide silicone according to the above [1] wherein the divalent organic group Y having a phenolic hydroxy group is a group having a phenolic hydroxy group in which a part or all of hydrogen atoms are substituted with an acid labile group represented by the general formula (3), said divalent organic group Y being represented by the following general formula (4):

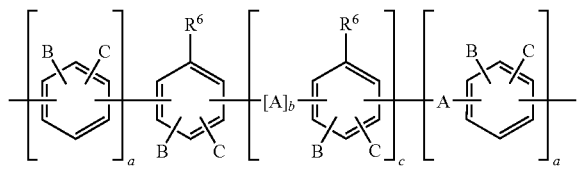

(4)

wherein A is independently a divalent organic group which is any one of the following divalent organic groups:

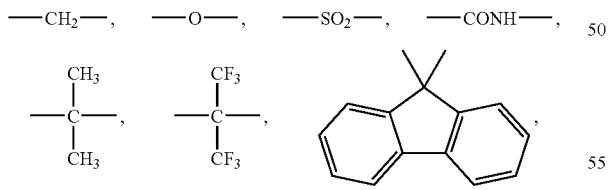

B and C are independently an alkyl group of 1 to 4 carbon atoms or a hydrogen atom, a is 0 or 1, b is 0 or 1, c is an integer of 0 to 10, and $R^6$ is independently a phenolic hydroxy group in which a part or all of hydrogen atoms are substituted with an acid labile group represented by the general formula (3).

[3] A polyimide silicone according to the above [1] or [2] wherein at least 50% by mole of Y is a group comprising a phenolic hydroxy group in which a part or all of hydrogen atoms are substituted with an acid labile group represented by the general formula (3).

[4] A polyimide silicone according to any one of the above [1] to [3] wherein the remaining divalent organic groups of Y is at least one member selected from the group consisting of a divalent organic group represented by the following general formula (5):

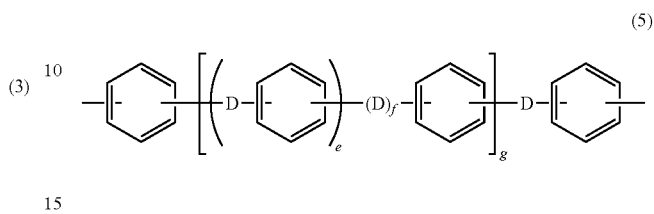

(5)

wherein D is independently any one of the following divalent organic groups

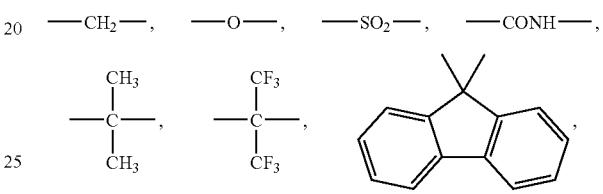

e and f are independently 0 or 1, and g is 0 or 1; and a divalent organic group represented by the following general formula (6):

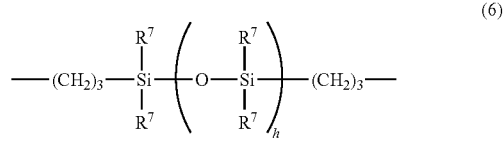

(6)

wherein $R^7$ is independently a monovalent hydrocarbon group of 1 to 8 carbon atoms, h is an integer of 1 to 80.

[5] A polyimide silicone according to any one of the above [1] to [4] wherein the remaining tetravalent groups of X is a tetravalent group W represented by any one of the following formulae:

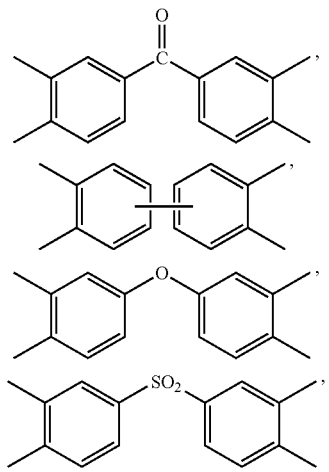

-continued

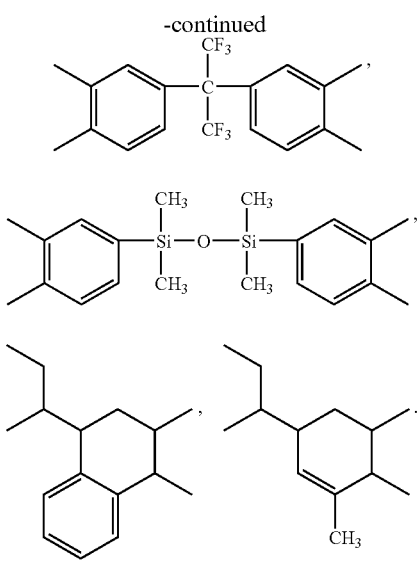

[6] A polyimide silicone according to the above [5] consisting of the two repeating units represented by the following general formulae (7):

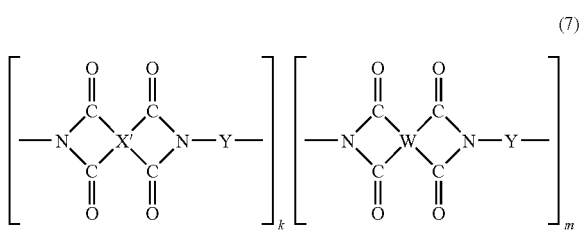

wherein X' is a group represented by the formula (2), Y and W are as defined above, and k and m are independently a positive integer with the proviso that k/(k+m) is at least 0.01.

[7] A photosensitive resin composition comprising the polyimide silicone of any one of the above [1] to [6] and a photoacid generator which generates an acid by irradiation of a light beam having a wave length in the range of 240 to 450 nm.

[8] A photosensitive resin composition comprising
   (A) the polyimide silicone of any one of the above [1] to [6],
   (B) a photoacid generator which generates an acid by irradiation of a light beam having a wave length in the range of 240 to 450 nm, and
   (C) a melamine compound, a glycoluril compound, a urea compound, an epoxy compound, or a compound containing at least two methylol derivatives in a molecule.

[9] A method for forming a pattern comprising the steps of
   (i) forming a layer of the cured photosensitive resin composition of the above [8] on a substrate,
   (ii) exposing the layer of the cured photosensitive resin composition to a light beam including a light of a wavelength of 240 to 450 nm through a photomask, and
   (iii) developing the exposed layer of the cured photosensitive resin composition by using an alkaline developer.

[10] A method for forming a pattern comprising the steps of
   (i) forming a layer of the cured photosensitive resin composition of the above [8] on a substrate,
   (ii) exposing the layer of the cured photosensitive resin composition to a light beam including a light of a wavelength of 240 to 450 nm through a photomask,
   (iii) developing the exposed layer of the cured photosensitive resin composition by using an alkaline developer, and
   (iv) curing the developed layer of the cured photosensitive resin composition at a temperature in the range of 100 to 250° C.

ADVANTAGEOUS EFFECTS OF INVENTION

Use of the photosensitive resin composition containing the polyimide silicone of the present invention enables production of a photocurable resin composition which can be exposed by a light beam having a wide range of wavelength, which can be formed into a thin film with no oxygen interference, and which can also be formed into a thick film having a thickness in excess of 20 μm. The composition is also capable of forming a pattern at a high resolution, and the cured film formed from this composition exhibits excellent adhesion to the substrate, heat resistance, and electric insulation, and the resulting film is suitable for the protective film of electric and electronic parts, semiconductor elements, and the like.

DETAILED DESCRIPTION OF THE INVENTION

Next, the present invention is described in further detail.
The polyimide silicone of the present invention comprises the repeating unit represented by the following general formula (1):

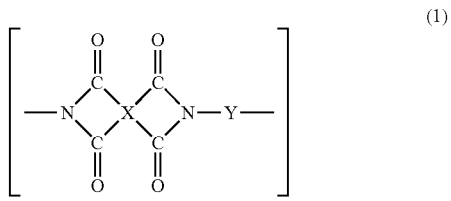

wherein X is a tetravalent group at least a part of which is a tetravalent organic group represented by the following general formula (2):

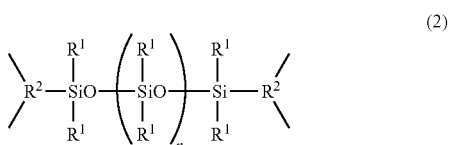

wherein $R^2$ is independently a monovalent hydrocarbon group of 1 to 8 carbon atoms, $R^2$ is independently a trivalent group, and n is an integer of 1 to 120 on average; and
Y is a divalent organic group at least a part of which is a divalent organic group having a phenolic hydroxy group in which a part or all of hydrogen atoms are substituted with an acid labile group represented by the following general formula (3):

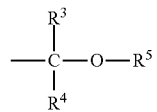

(3)

wherein $R^3$ and $R^4$ are independently a hydrogen atom or a straight, branched, or cyclic alkyl group of 1 to 6 carbon atoms, and $R^5$ is a straight, branched, or cyclic alkyl group of 1 to 30 carbon atoms, an aryl group of 6 to 20 carbon atoms, or an aralkyl group of 7 to 20 carbon atoms. $R^3$ and $R^4$, $R^3$ and $R^5$, or $R^4$ and $R^5$ may be bonded to each other to form a ring together with the carbon atom or the carbon atom and the oxygen atom to which they are bonded represent a ring with the proviso that, when they form a ring, the $R^3$, R', and $R^5$ involved in the formation of the ring are independently a straight or branched alkylene group of 1 to 18 carbon atoms.

The polyimide silicone of the present invention has a characteristic feature that at least a part of X comprises a structure X' represented by the formula (2). This unit can impart the flexibility to the resin. In the formula (2), $R^2$ is independently a monovalent hydrocarbon group of 1 to 8 carbon atoms. Exemplary such monovalent hydrocarbon groups include alkyl groups such as methyl group, ethyl group, propyl group, butyl group, pentyl group, and hexyl group; cycloalkyl groups such as cyclopentyl group and cyclohexyl group; aryl groups such as phenyl group; aralkyl groups such as benzyl group and phenethyl group; and alkenyl groups such as vinyl group, allyl group, propenyl group, isopropenyl group, and butenyl group. Among these, the preferred are methyl group, ethyl group, phenyl group, and vinyl group in view of the availability of the ingredients.

In formula (2), $R^2$ is independently the residue of an alkyl succinic anhydride such as propyl succinic anhydride, norbornyl acid anhydride, propylnadic anhydride, or phthalic anhydride from which carboxyl group or carboxylic anhydride group has been removed. Preferably, $R^2$ is alkyl succinic anhydride, and in particular, propyl succinic anhydride from which carboxylic anhydride group has been removed. n is an integer of 1 to 120 on average, preferably 3 to 80, and more preferably 5 to 50.

The tetravalent organic group X' of the X represented by the formula (2) may have a structure as shown below:

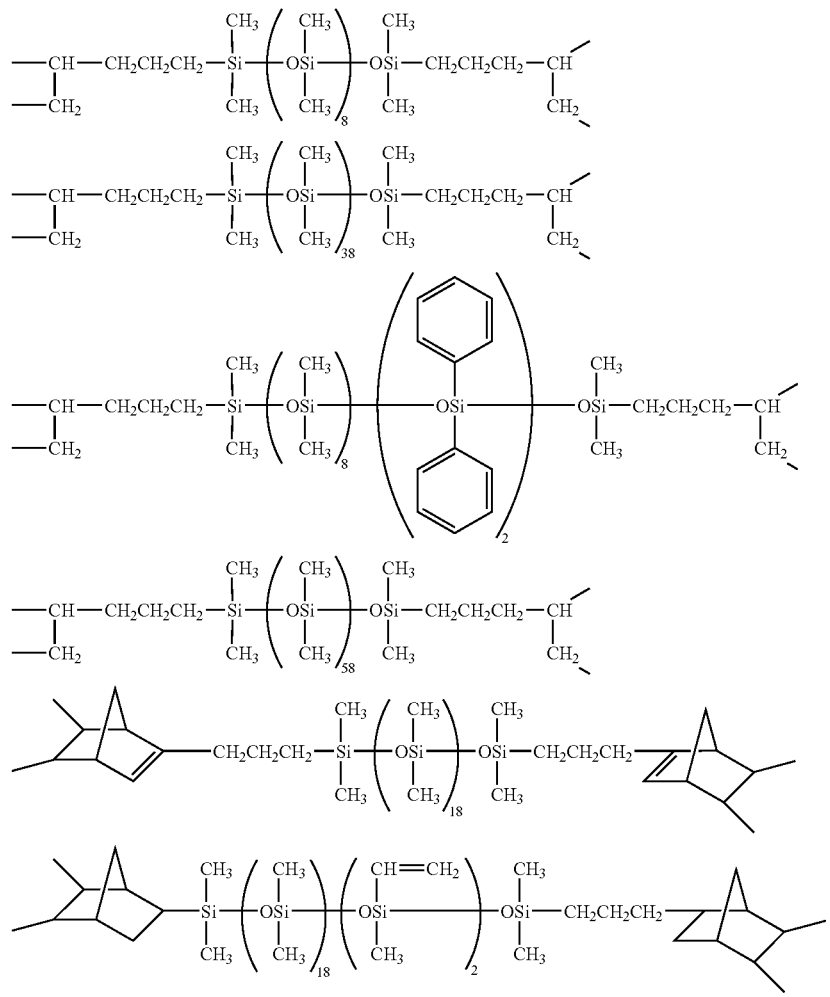

The X may be derived from a modified silicone produced by reacting the acid anhydride having an unsaturated group such as succinic anhydride, norbornyl acid anhydride, propylnadic anhydride, phthalic anhydride, or the like with an organohydrogen polysiloxane. Distribution of the number of siloxane unit in the resulting acid anhydride-modified polysiloxane depends on the distribution of the number of siloxane unit in the organohydrogen polysiloxane, and accordingly, n in the formula (2) is an average.

The remaining tetravalent group of X (hereinafter referred to as W) may be any tetravalent group known in the art such as the following groups.

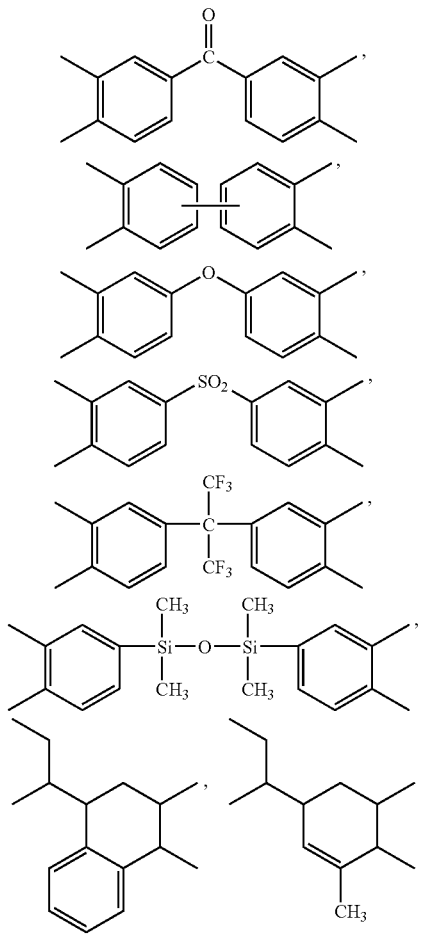

In this case, the proportion of X' (the group represented by the formula (2)) and W are as described below.

In formula (1), Y is a divalent organic group, and at least a part of Y is a group having a phenolic hydroxy group in which a part or all of hydrogen atoms are substituted with an acid labile group represented by the general formula (3). Preferably, Y is the group represented by the following formula (4):

(4)

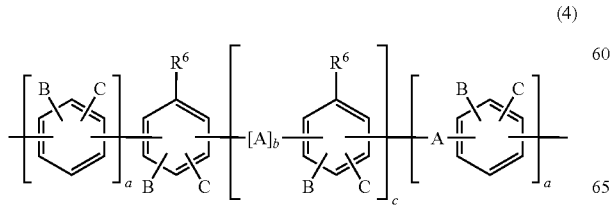

wherein A is independently a divalent organic group which is any one of the following divalent organic groups:

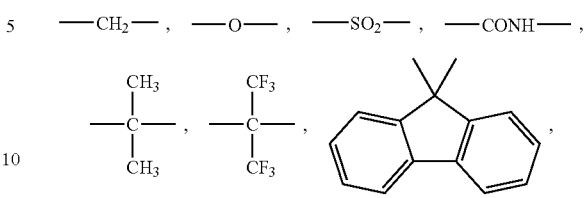

a is 0 or 1, b is 0 or 1, and c is an integer of 0 to 10. B and C are independently an alkyl group of 1 to 4 carbon atoms such as methyl group, ethyl group, propyl group, and butyl group or a hydrogen atom, and the preferred are methyl group and hydrogen atom in view of the availability of the ingredients. In the formula (4), $R^6$ is independently a phenolic hydroxy group in which a part or all of hydrogen atoms are substituted with an acid labile group represented by the general formula (3).

Examples of the group represented by the formula (4) include those as shown below:

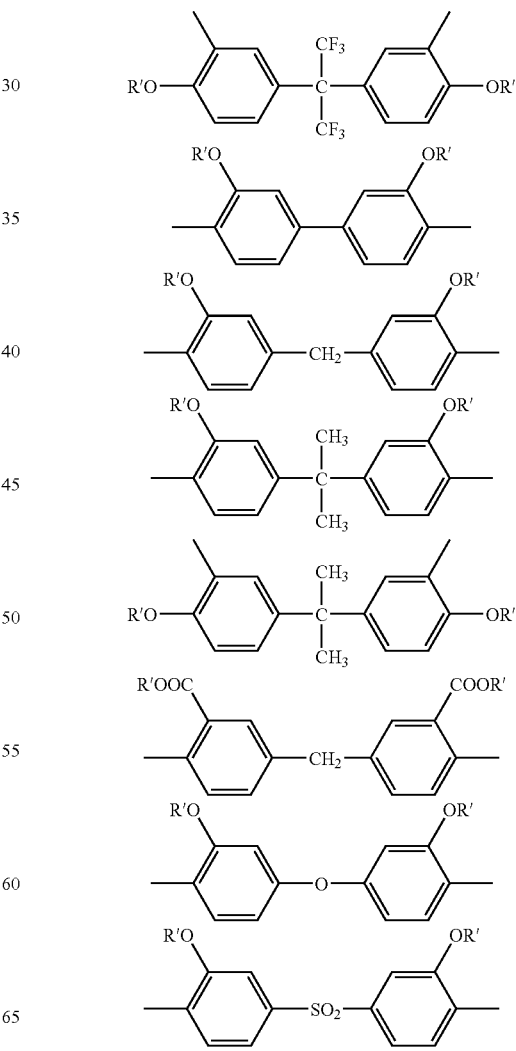

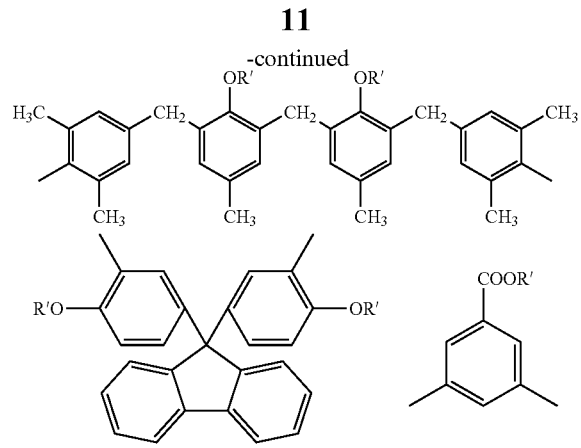

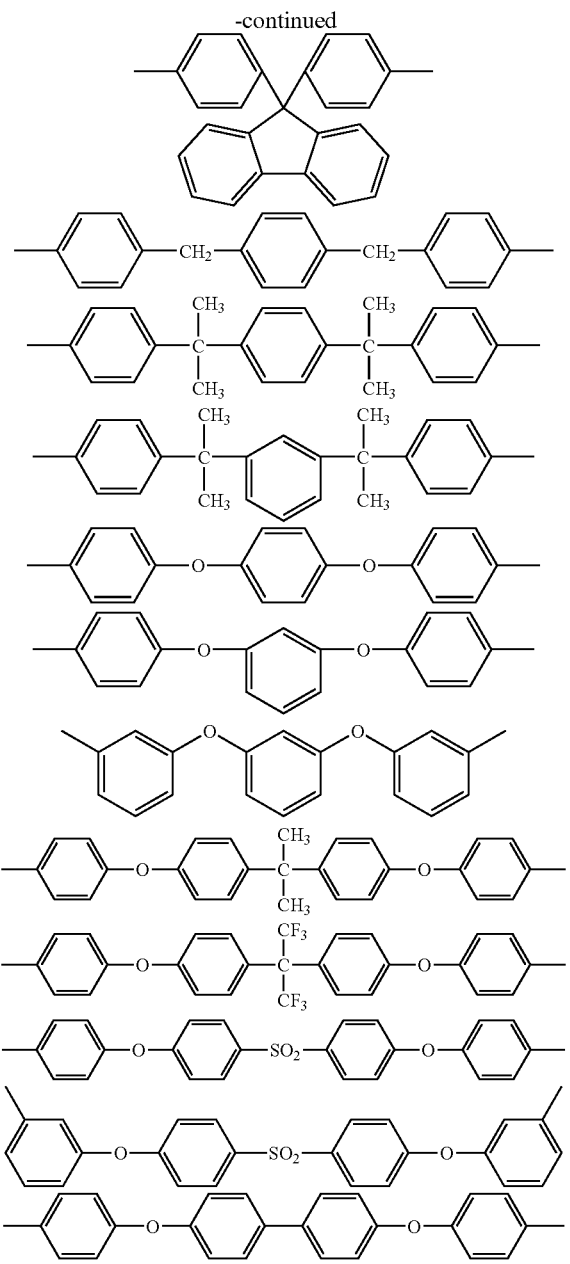

wherein R' is a hydrogen atom or the acid labile group represented by the formula (3).

In this case, preferably 30 to 100% by mole, and more preferably 40 to 80% by mole of the hydrogen atoms in the phenolic hydroxy group are substituted with the acid labile group of the formula (3). An excessively low degree of substitution may result in the pattern deformation in the development, or alternatively, may result in poor degree of the film remaining after the development. On the other hand, excessively high degree of substitution may result in the reduced sensitivity.

The remaining divalent organic group of Y is represented by the general formula (5) and/or the general formula (6) as described below:

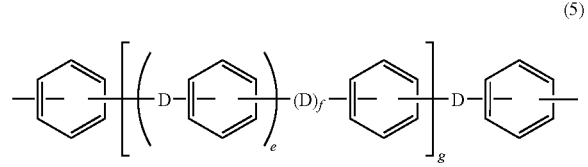

(5)

wherein D is a divalent organic group as in the case of A, e and f are independently 0 or 1, and g is 0 or 1.

Examples of the group represented by the formula (5) include those as shown below:

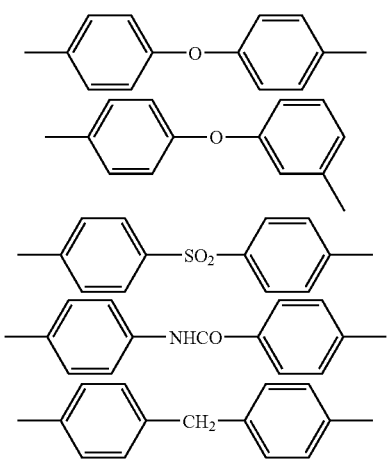

In the group represented by the following formula (6),

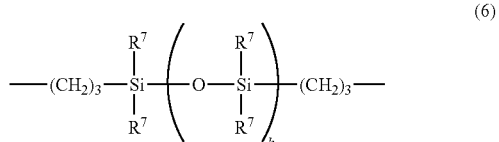

(6)

$R^7$ is independently a monovalent hydrocarbon group of 1 to 8 carbon atoms, for example, an alkyl group such as methyl group, ethyl group, propyl group, butyl group, pentyl group, and hexyl group; a cycloalkyl group such as cyclopentyl group and cyclohexyl group; an aryl group such as phenyl group; an aralkyl group such as benzyl group and phenethyl group; or an alkenyl group such as vinyl group, allyl group, propenyl group, isopropenyl group, and butenyl group. The preferred are methyl group, ethyl group, phenyl group, and vinyl group in view of the availability of the ingredients. h is an integer of 1 to 80, preferably 3 to 70, and more preferably 5 to 50.

In this case, at least 50% by mole, and more preferably at least 80% by mole of Y is the group having a phenolic hydroxy group in which a part or all of the hydrogen atoms are substituted with the acid labile group represented by the formula (3). When this proportion is too low, sufficient development with an alkaline solution may not be realized.

The polyimide silicone of the present invention having such structure has a number average molecular weight in the range of 5,000 to 200,000, and preferably 8,000 to 100,000 in terms of polystyrene, which is measured by gel permeation chromatography (GPC). The polyimide silicone having a molecular weight below such range suffers from the insufficient strength of the resulting film, whereas the polyimide silicone having a molecular weight beyond such range suffers from poor compatibility with the solvent, and hence, from inconvenient handling.

Preferably, the polyimide silicone of the present invention consists of the two repeating units represented by the following formulae (7):

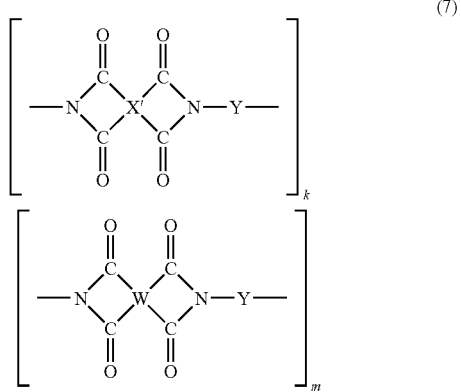

(7)

wherein X', Y, and W are as defined above, and k and m are respectively a positive integer with the proviso that k/(k+m) is at least 0.01. The sum of k and m is a number such that the polyimide silicone has a number average molecular weight in the range as described above, and the k and m are typically an integer of $3 \leq k \leq 400$ and $0 \leq m \leq 400$. These two repeating units may constitute either a block copolymer or a random copolymer.

The ratio k/(k+m) of the number of the repeating units containing the X' in the total number of the repeating units is at least 0.01, preferably at least 0.2, and more preferably at least 0.5. When the ratio is below such range, it will be difficult to realize a sufficient flexibility. No particular upper limit is set for the k/(k+m), and the upper limit is the theoretical value of 1.0.

The polyimide silicone of the present invention can be produced by reacting a diamine having a phenol structure for deriving Y of the formula (1), an acid anhydride-modified silicone for deriving X, and optionally, an acid dianhydride for deriving W, and further, a diamine and/or a diaminosilicone not containing a phenolic hydroxyl group by the method as described below to produce a polyamic acid, and conducing cyclization by dehydration of the acid amide moiety of the polyamic acid by heating the polyamic acid to a temperature of 80 to 200° C., and preferably 140 to 180° C. or by adding a mixture of acetic anhydride and pyridine to the polyamic acid solution and heating the resulting mixture to a temperature of around 50° C.

Examples of the diamine having the phenol structure include 3,3'-diamino-4,4'-dihydroxy biphenyl, 2,2'-diamino-4,4'-dihydroxy biphenyl, 2,2'-bis(4-amino-3-hydroxyphenyl)propane, 2,2'-bis(3-amino-4-hydroxyphenyl)propane, 9,9'-bis(3-amino-4-hydroxyphenyl)fluorene, 2,2'-methylenebis[6-(4-amino-3,5-dimethylbenzyl)-4-methyl]-phenol, 3,3'-diamino-4,4'-dihydroxy diphenyl ether, and 2,2'-bis(3-amino-4-hydroxyphenyl)hexafluoropropane, which may be used in combination with 3,5-diaminobenzoic acid, 2,4-diaminobenzoic acid, 3,3'-dicarboxy-4,4'-diaminodiphenylmethane, 4,4'-diaminobiphenyl-3,3'-dicarboxylic acid, 4,4'-diaminobiphenyl-2,2'-dicarboxylic acid, 3,3'-dicarboxy-4,4'-diaminodiphenyl ether, or the like.

Examples of the acid anhydride-modified silicone used for deriving X' include those which have acid anhydride structures in both end in the formulae as mentioned above for the X'.

Examples of the acid dianhydride used for deriving W include 3,3',4,4'-diphenylsulfonetetracarboxylic dianhydride, 3,3',4,4'-biphenyltetracarboxylic dianhydride, 2,3,3',4-biphenyltetracarboxylic dianhydride, 5-(2,5-dioxotetrahydro-3-furanyl)-3-methyl-3-cyclohexene-1,2-dicarboxylic anhydride, 4-(2,5-dioxotetrahydrofuran-3-yl)-1,2,3,4-tetrahydronaphthalene-1,2-dicarboxylic anhydride, 1,2,3,4-butanetetracarboxylic dianhydride, 3,3',4,4'-benzophenonetetracarboxylic dianhydride, 4,4'-hexafluoropropylidene bisphthalic dianhydride, 2,2-bis(p-trimethoxyphenyl)propane, 1,3-tetramethyldisiloxane bisphthalic dianhydride, and 4,4'-oxydiphthalic dianhydride.

Example of the diamine not containing a phenolic hydroxy group include 4,4'-diaminobenzanilide, 4,4'-diaminodiphenyl ether, 3,4-diaminodiphenyl ether, 4,4'-diaminodiphenylsulfone, 3,3'-dimethyl-4,4'-diaminobiphenyl, 4,4'-(p-phenylene diisopropylidene)dianiline, 4,4'-(m-phenylene diisopropylidene)dianiline, 1,3-bis(4-aminophenoxy)benzene, 1,4-bis(4-aminophenoxy)benzene, 1,3-bis(3-aminophenoxy)benzene, 2,2'-bis[4-(4-aminophenoxy)phenyl]propane, 2,2-bis[4-(4-aminophenoxy)phenyl]hexafluoropropane, bis[4-(4-aminophenoxy)phenyl]sulfone, bis[4-(3-aminophenoxy)phenyl]sulfone, 4,4'-bis(4-aminophenoxy)biphenyl, and 9,9'-bis(4-aminophenyl)fluorene.

In the synthesis of the polyamic acid, the ratio of the total amount of the diamine components to the total amount of the tetracarboxylic dianhydride components is adequately determined depending on the molecular weight and the like of the polyimide. The ratio is preferably 0.95 to 1.05, and more preferably 0.98 to 1.02 at a molar ratio. It is to be noted that a monofunctional acid anhydride such as phthalic anhydride, or an amine compound such as aniline may be added for adjusting the molecular weight of the polyimide. In such a case, the monofunctional acid anhydride or the amine compound may be added at an amount of up to 10% by mole to the total amount of tetracarboxylic dianhydride component or the diamine component.

The reaction of the diamine with the acid dianhydride is typically conducted in a solvent which is not particularly limited as long as it can dissolve the polyimide silicone. Exemplary such solvents include ethers such as diglyme, triglyme, tetrahydrofuran, and anisole; ketones such as cyclohexanone, 2-butanone, methyl isobutyl ketone, 2-heptanone, 2-octanone, and acetophenone; esters such as butyl acetate, methyl benzoate, and γ-butyrolactone; cellosolves such as butyl cellosolve acetate and propylene glycol monomethyl ether acetate; amides such as N,N-dimethylformamide, N,N'- dimethylacetamide, and N-methyl-2-pyrrolidone; and aromatic hydrocarbons such as toluene and xylene. Preferably, the solvent is diglyme, cyclohexanone, γ-butyrolactone, propylene glycol monomethyl ether acetate, N,N'-dimethylacetamide, or n-methyl-2-pyrrolidone, which may be used alone or in combination of two or more. The solvent is typically adjusted so that the concentration of the polyimide is in the range of 10 to 40% by weight by considering yield per batch, the viscosity of the solution, and the like.

Next, the method for substituting the hydrogen atoms of the phenolic hydroxy group in the polyimide silicone with an acid labile group is described. For the acid labile group of the general formula (3), examples of a straight, branched, or cyclic alkyl group of 1 to 6 carbon atoms of the $R^3$ and $R^4$ include methyl group, ethyl group, n-propyl group, isopropyl group, n-butyl group, isobutyl group, tert-butyl group, n-pentyl group, isopentyl group, neopentyl group, hexyl group, cyclopentyl group, and cyclohexyl group.

For the $R^5$, examples of a straight, branched, or cyclic alkyl group of 1 to 30 carbon atoms include methyl group, ethyl group, propyl group, isopropyl group, n-butyl group, isobutyl group, tert-butyl group, n-pentyl group, isopentyl group, neopentyl group, n-hexyl group, n-heptyl group, n-octyl group, n-decyl group, n-dodecyl group, n-hexyl group, palmityl group, n-stearyl group, cyclopropyl group, tricyclodecane group, and cholesteryl group. Examples of the aryl group of 6 to 20 carbon atoms include phenyl group, tolyl group, ethylphenyl group, propylphenyl group, dimethylphenyl group, methylethylphenyl group, naphthyl group, furyl group, and biphenyl group. Exemplary aralkyl groups of 7 to 20 carbon atoms include benzyl group, methylbenzyl group, propylbenzyl group, and dimethylbenzyl group.

The novel polyimide silicone of the present invention can be produced by the addition reaction of the precursor polyimide silicone with an alkenyl ether compound or a dialkenyl ether compound in the presence of an acid catalyst. Examples of the alkenyl ether compounds include methyl vinyl ether, ethyl vinyl ether, n-propyl vinyl ether, isopropyl vinyl ether, n-butyl vinyl ether, isobutyl vinyl ether, sec-butyl vinyl ether, ethyl-1-propenyl ether, cyclohexyl vinyl ether, methyl-1-propenyl ether, isopropenyl methyl ether, isopropenyl ethyl ether, dihydrofuran, or dihydropyran. Examples of the dialkenyl ether compound include ethylene glycol divinyl ether, triethylene glycol divinyl ether, 1,3-propanediol divinyl ether, 1,3-butanediol divinyl ether, 1,4-butanediol divinyl ether, neopentyl glycol divinyl ether, hexanediol divinyl ether, 1,4-cyclohexanediol divinyl ether, pentaerythritol divinyl ether, or ethylene glycol diethylene vinyl ether. Proportion of the hydrogen atoms of the phenolic hydroxy group to which the acid labile group is introduced is typically 30 to 100% by mole, and preferably 40 to 80% by mole.

The reaction for introducing the acid labile group may be conducted in a solvent such as an aprotic polar solvent such as dimethylformamide, dimethylacetamide, tetrahydrofuran, 1,4-dioxane, ethyl acetate, or diglyme which may be used alone or in combination of two or more. Exemplary acid catalysts that may be used include hydrochloric acid, sulfuric acid, trifluoromethanesulfonic acid, p-toluenesulfonic acid, methanesulfonic acid, and pyridinium p-toluenesulfonate.

The polyimide silicone of the present invention is useful as a base resin for a photosensitive resin composition, and this invention also provides a photosensitive resin composition comprising a solution of this organopolysiloxane compound and a photoacid generator in a solvent.

Next, the photoacid generator (B) is described. The photoacid generator is not particularly limited as long as it generates an acid by the irradiation of a light beam having a wavelength of 240 to 450 nm. Exemplary such photoacid generators include:

onium salts such as diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, bis(4-tert-butylphenyl)iodonium hexafluorophosphate, and diphenyl(4-thiophenoxyphenyl)sulfonium hexafluoroantimonate;

diazomethane derivatives such as bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane;

glyoxime derivatives such as bis-o-(p-toluenesulfonyl)-α-dimethylglyoxime, bis-o-(p-toluenesulfonyl)-α-diphenylglyoxime, bis-o-(p-toluenesulfonyl)-α-dicyclohexylglyoxime, bis-o-(p-toluenesulfonyl)-2,3-pentanedione glyoxime, bis-(p-toluenesulfonyl)-2-methyl-3,4-pentanedione glyoxime, bis-o-(n-butanesulfonyl)-α-dimethylglyoxime, bis-o-(n-butanesulfonyl)-α-diphenylglyoxime, bis-o-(n-butanesulfonyl)-α-dicyclohexylglyoxime, bis-o-(n-butanesulfonyl)-2,3-pentanedione glyoxime, bis-o-(n-butanesulfonyl)-2-methyl-3,4-pentanedione glyoxime, bis-o-(methanesulfonyl)-α-dimethylglyoxime, bis-o-(trifluoromethanesulfonyl)-α-dimethylglyoxime, bis-o-(1,1,1-trifluoroethanesulfonyl)-α-dimethylglyoxime, bis-o-(tert-butanesulfonyl)-α-dimethylglyoxime, bis-o-(perfluorooctanesulfonyl)-α-dimethylglyoxime, bis-o-(cyclohexanesulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzenesulfonyl)-α-dimethylglyoxime, bis-o-(xylenesulfonyl)-α-dimethylglyoxime, and bis-o-(camphorsulfonyl)-α-dimethylglyoxime;

oxime sulfonate derivatives such as α-(benzenesulfoniumoxyimino)-4-methylphenyl acetonitrile;

β-ketosulfone derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonate ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; and imid-yl-sulfonate derivatives such as phthalimid-yl-triflate, phthalimid-yl-tosylate, 5-norbornene-2,3-dicarboxylmid-yl-triflate, 5-norbornene-2,3-dicarboxylmid-yl-tosylate, 5-norbornene-2,3-dicarboxylmid-yl-n-butylsulfonate, and n-trifluoromethylsulfonyloxy naphthylimide.

Other examples include imino sulfonates such as (5-(4-methylphenyl)sulfonyloxyimino-5H-thiophen-2-ylidene)-(2-methylphenyl)acetonitrile and (5-(4-(4-methylphenylsulfonyloxy)phenylsulfonyloxyimino)-5H-thiophen-2-ylidene)-(2-methylphenyl)-acetonitrile, and 2-methyl-2[(4-methylphenyl)sulfonyl]-1-[(4-methylthio)-phenyl]-1-propane. Among these, the preferred are imid-yl-sulfonates, imino sulfonates, and oxime sulfonates The photoacid generator may be used alone or in combination of two or more, and the photoacid generator may be incorporated in an amount of 0.05 to 20 parts by weight, and in particular, 0.2 to 5 parts by weight per 100 parts by weight of the polyimide silicone of the present invention. When incorporated at less than 0.05 parts by weight, contrast (difference in the speed of dissolution in the developer solution between the exposed area and the non-exposed area) may not be sufficient, while incorporation in excess of 20 parts by weight may invite poor resolution due to the photoabsorption by the photoacid generator itself.

Next, the thermal curing agent (C) is described. The thermal curing agent is not particularly limited as long as it promotes curing by crosslinking through condensation or addition between the phenolic hydroxy groups in the polyimide silicone of the present invention or the curing agents. Exemplary thermal curing agents include a melamine compound, a glycoluril compound, a urea compound, an epoxy compound, or a compound containing at least two methylol derivatives in a molecule.

Exemplary melamine compounds include hexamethylolmelamine hexamethyl ether, hexamethylolmelamine hexabutyl ether, tetramethoxymethylbenzoguanamine, and tetrabutoxymethylbenzoguanamine.

Exemplary glycoluril compounds include tetramethoxymethylglycoluril and tetrabutoxymethylglycoluril.

Exemplary urea compounds include tetramethoxymethylurea, dimethoxymethylethyleneurea, and dimethoxymethylpropyleneurea.

Exemplary epoxy compounds include bisphenol A epoxy resins such as phenol novolac epoxy resin, cresol novolac epoxy resin, and diglycidyl bisphenol A; bisphenol F epoxy resins such as diglycidyl bisphenol F; triphenylmethane epoxy resins such as triphenylolpropane triglycidyl ether; cyclic aliphatic epoxy resin such as 3,4-epoxycyclohexylmethyl-3,4-epoxycyclohexane carboxylate; glycidyl ester resins such as diglycidyl phthalate, diglycidyl hexahydrophthalate, and dimethylglycidyl phthalate; glycidyl amine resins such as tetraglycidyl diaminodiphenylmethane, triglycidyl-p-aminophenol, diglycidylaniline, diglycidyltoluidine, and tetraglycidylbisaminomethylcyclohexane.

Exemplary methylol derivatives include compounds having at least two methylol derivatives such as methylol group or an alkoxymethyl group in a molecule. Exemplary difunctional methylol derivatives include (2-hydroxy-5-methyl)-1,3-benzenedimethanol, 2,6-di(methoxymethyl)-4-methylphenol, 6-hydroxy-5-methyl-1,3-benzenedimethanol, 2,4-di(hydroxymethyl)-6-cyclohexylphenol, 2,6-di(methoxymethyl)-4-(1,1'-di-methylethyl)phenol, 3,3'-methylenebis(2-hydroxy-5-methylbenzene methanol), 4,4'-[1,4-phenylenebis(1-methylethylidene)bis[2-methyl-6-hydroxymethylphenol], 2-hydroxy-5-ethyl-1,3-benzenedimethanol, 2-hydroxy-4,5-dimethyl-1,3-benzenedimethanol, 4-(1,1'-dimethylethyl)-2-hydroxy-1,3-benzenedimethanol, 2-hydroxy-5-cyclohexyl-1,3-benzenedimethanol, 2-hydroxy-5-(1,1',3,3'-tetramethylbutyl)-1,3-benzenedimethanol, 2-hydroxy-5-fluoro-1,3-benzenedimethanol, 4,4'-methylenebis(2-methyl-6-hydroxymethylphenol), and 2,6-bis[(2-hydroxy-3-hydroxymethyl-5-methylphenyl)methyl]-4-methylphenol.

Exemplary trifunctional methylol derivatives include 2-hydroxy-1,3,5-benzenetrimethanol and 3,5-dimethyl-2,4,6-trihydroxymethylphenol. Exemplary tetrafunctional methylol derivatives include 3,3',5,5'-tetrakis (hydroxymethyl)[(1,1'-biphenyl)-4,4'-diol], 2,3,5,6-tetra(hydroxymethyl)-1,4-benzenediol, 4,4'-methylenebis[2,6-bis(hydroxymethyl)phenol], 4,4'-(1-methylethylidene)bis[2,6-bis(hydroxymethyl) phenol], and 3,3',5,5'-tetrakis (methoxymethyl)[(1,1'-biphenyl)-4,4'-diol]. Exemplary hexafunctional methylol derivatives include 4,4',4"-methylidynetris(2,6-dihydroxymethylphenol) and 4,4',4"-ethylidynetris(2,6-dihydroxymethylphenol).

The thermal curing agent may be used alone or in combination of two or more, and preferably in an amount of 0.1 to 50 parts by weight, and in particular, 2 to 40 parts by weight per 100 parts by weight of the polyimide silicone of the present invention. Sufficient crosslinking density may not be realized by the incorporation in an amount of less than 0.1 part by weight, while incorporation in excess of 50 parts by weight may invite reduced transparency due to the photoabsorption by the thermal curing agent itself as well as insufficient storage stability.

Next, the solvent is not particularly limited as long as the polyimide silicone (A) of the present invention, the photoacid generator (B), and the thermal curing agent (C) are sufficiently soluble in the solvent, and the resulting film exhibits favorable properties.

Exemplary solvents include ketones such as cyclohexanone, cyclopentanone, and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene glycol-mono-tert-butyl ether acetate, and γ-butyrolactone; which may be used alone or in combination of two or more.

Among these, the preferred are cyclohexanone, cyclopentanone, propylene glycol monomethyl ether acetate, γ-butyrolactone, and mixtures of these solvents to which the polyimide silicone (A) of the present invention, the photoacid generator (B), and the thermal curing agent (C) are highly soluble.

The organic solvent as described above may be used at 50 to 2,000 parts by weight, and in particular, 100 to 1,000 parts by weight per 100 parts by weight of the total solid content of the components (A) to (C). When used at less than 50 parts by weight, compatibility of the components (A) to (C) may be insufficient, whereas use in excess of 2,000 parts by weight does not contribute for the improvement of the compatibility while the excessively reduced viscosity may be unsuitable for resin coating.

The polyimide silicone of the present invention may also contain additives other than the components as described above.

An example of such additives is a surfactant commonly used in the art to improve coating workability. The surfactant is preferably a nonionic surfactant such as fluorine-based surfactant such as perfluoroalkyl polyoxyethylene ethanol, fluorinated alkyl ester, perfluoroalkyl amine oxide, and fluorine-containing organosiloxane compound.

The surfactant may be a commercially available surfactant such as Fluorad "FC-4430" (manufactured by Sumitomo 3M), Surflon "S-141" and "S-145" (both manufactured by Asahi Glass Co., Ltd.), Unidyne "DS-401", "DS-4031" and "DS-451" (all manufactured by Daikin Industries, Ltd.), Megaface "F-8151" (manufactured by DIC Corporation), and "X-70-093" (manufactured by Shin-Etsu Chemical Co., Ltd.). Among these, the preferred are Fluorad "FC-4430" (manufactured by Sumitomo 3M) and "X-70-093" (manufactured by Shin-Etsu Chemical Co., Ltd.).

Another additive which may be used is a nitrogen-containing compound which improves environmental stability, pattern stability, and post-exposure delay stability. Exemplary such nitrogen-containing compounds include secondary and tertiary aliphatic amines such as diethylamine, di-n-propylamine, diethanolamine, trimethylamine, triethylamine, tri-n-propylamine, triethanolamine, and tripropanolamine.

Next, the method for forming a pattern using the photosensitive resin composition of the present invention is described. In this method, the photosensitive resin composition of the present invention is coated on the substrate by a method known in the art such as dipping, spin coating, and roll coating to form a resist layer, and optionally prebaking the resist layer by a heater such as a hot plate, oven, and the like.

Exemplary substrates include silicon wafer and plastic or ceramic circuit board.

The resist layer may be formed in a thickness of 0.1 to 50 µm, and in particular, in a thickness of 1.0 to 30 µm, and the present invention enables formation of a thick resist layer having a thickness of at least 10 µm, and in particular, at least 20 µm.

Next, the substrate is irradiated with a light beam of various wavelength, for example, UV beam such as g ray and i ray through a photomask for exposure of the required part. After the exposure, the substrate is optionally heated to improve the sensitivity of the development.

After the exposure or the exposure followed by the heating, the pattern is developed by a developer solution which may be any alkaline developer solution known in the art such as an aqueous solution of tetramethylammonium hydroxide by a method commonly used in the art, for example, immersion of the substrate on which the pattern has been formed in the developer solution. The substrate is then subjected to optional treatments such as washing, rinsing, and drying to produce the desired pattern.

The polyimide silicone of the present invention is hardly soluble or insoluble in the alkaline developer solution since the phenolic hydroxy group is protected because a part or all of hydrogen atoms of the phenolic hydroxy group are substituted with an acid labile group. However, the acid labile group in the exposed area is dissociated from the phenolic hydroxy group by the action of the acid generated from the photoacid generator, and as a result, the exposed area is dissolved by the alkaline developer solution. The required positive pattern is thereby formed.

If desired, the resulting pattern is heated to 100 to 250° C. for about 10 minutes to 10 hours by using an oven or a hot plate to increase the crosslinking density and remove the remaining volatile component. A cured film having improved heat resistance, high transparency, low dielectric constant, and excellent solvent resistance is thereby formed.

Accordingly, the cured film formed from the photosensitive resin composition exhibits excellent adhesion to the substrate, heat resistance, electric insulation, and mechanical properties, and the film is suitable for the protective film of electric and electronic parts, semiconductor elements, and the like. Since a fine pattern can be formed, and the formed film exhibits excellent adhesion to the substrate, electric properties, and mechanical properties, the film is well adapted for applications such as a protective film of a semiconductor element, a protective film of wiring, a cover lay film, a solder resist, and MEMS.

EXAMPLES

Next, the present invention is described in further detail by referring to the Synthetic Examples, Examples, and Comparative Examples which by no means limit the scope of the present invention.

Synthetic Example 1

Synthesis of Polyimide Silicone A

A flask equipped with a stirrer, a thermometer, and a nitrogen purge system was charged with 50.2 g (0.05 mole) of 4,4'-oxydiphthalic dianhydride, 51.7 g (0.05 mole) of an acid anhydride-modified siloxane having an average structure represented by the following formula and 300 g of diglyme.

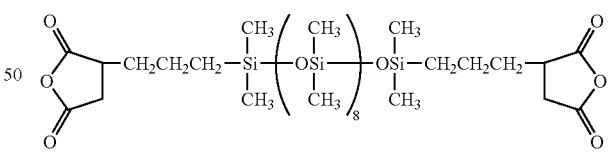

To this flask, 36.6 g (0.1 mole) of 2,2'-bis(3-amino-4-hydroxyphenyl)hexafluoropropane was added so that the temperature of the reaction system does not exceed 50° C. The reaction mixture was stirred at room temperature for 10 hours. Next, a reflux condenser with a moisture trap was provided on the flask, and 100 g of toluene was added. The reaction system was heated to 150° C., and maintained at this temperature for 6 hours to obtain a brown solution.

The resulting brown solution was cooled to room temperature (25° C.), and was then added to methanol. The resulting precipitate was collected by filtration, and the solid was dried to produce polyimide silicone A having the following repeating unit:

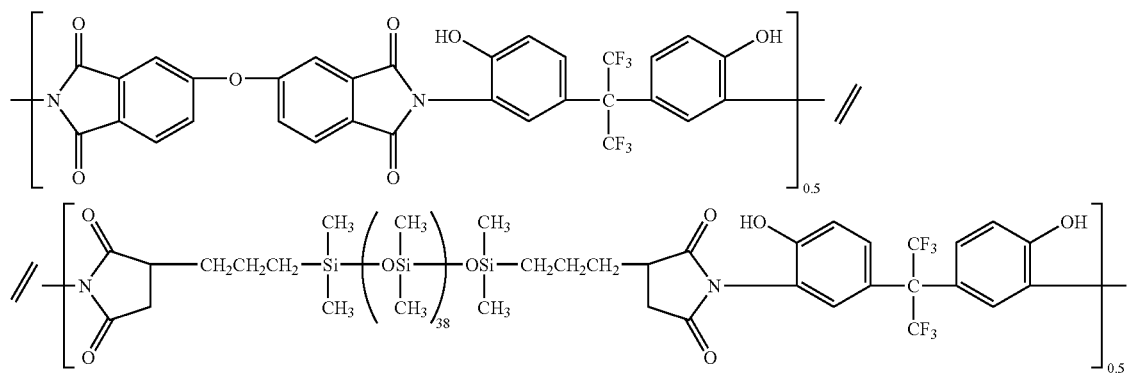

A part of this polyimide silicone A was dissolved in cyclopentanone to obtain 15 g of solution A1 having a solid content of 35% and 15 g of solution A2 having a solid content of 55%.

Synthetic Example 2

Synthesis of Acetalized Polyimide Silicone B 50 g of dried powder of the polyimide silicone A produced in Synthetic Example 1 was dissolved in 450 g of tetrahydrofuran in a flask equipped with a stirrer, a thermometer, and a nitrogen purge system, and 0.185 g of methanesulfonic acid was added. After stirring the mixture for 20 minutes, 4.855 g of ethyl vinyl ether was added, and the mixture was stirred at room temperature for 12 hours. Next, 0.171 g of 28% ammonia solution was added, and the mixture was stirred for 30 minutes, and the mixture was added to 5 L of 0.01 mol/L of aqueous solution of acetic acid. The resulting precipitate was washed with pure water and dried to produce the desired acetalized polyimide silicone B. This polyimide silicone B was dissolved in cyclopentanone to produce 100 g of solution having a solid content of 40%. When the resin was analyzed by $^1$H-NMR, the degree of acetalization was 47% by mole. This resin was dissolved in cyclopentanone to obtain 80 g of solution B1 having a solid content of 40%.

Synthetic Example 3

Reference Example

Synthesis of Acetalized Polyimide Silicone C 10 g of dried powder of the polyimide silicone A produced in Synthetic Example 1 was dissolved in 90 g of tetrahydrofuran in a flask equipped with a stirrer, a thermometer, and a nitrogen purge system, and 0.0273 g of methanesulfonic acid was added. After stirring the mixture for 20 minutes, 0.715 g of ethyl vinyl ether was added, and the mixture was stirred at room temperature for 1 hours. Next, 0.0261 g of 28% ammonia solution was added, and the mixture was stirred for 30 minutes, and the mixture was added to 1 L of 0.01 mol/L of aqueous solution of acetic acid. The resulting precipitate was washed with pure water and dried to produce the desired acetalized polyimide silicone C. This polyimide silicone C was dissolved in cyclopentanone to produce 20 g of solution having a solid content of 40%. When the resin was analyzed by $^1$H-NMR, the degree of acetalization was 14% by mole. This resin was dissolved in cyclopentanone to obtain 20 g of solution C1 having a solid content of 40%.

Example 1

0.040 g of [5-(4-(4-methylphenylsulfonyloxy)phenyl-sulfonyloxyimino)-5H-thiophen-2-ylidene]-(2-methylphenyl)-acetonitrile (photoacid generator) and 0.008 g of X-70-093 (surfactant) were added to and dissolved in 10 g of the cyclopentanone solution of the acetalized polyimide silicone B (solution B1) obtained in Synthetic Example 2, and the mixture was filtered through a membrane filter having a pore size of 0.5 μm to prepare a resist solution. Next, this resist solution was coated on a silicon wafer (6 inch) by a spinner, and prebaked at 120° C. on a hot plate for 120 seconds to form a resist film having a thickness of 7.0 μm. The patterning exposure was conducted by using an i beam stepper (NSR-1755i7A manufactured by Nikon Corporation, NA=0.5), and puddle development was then conducted for 200 seconds by using 2.38% by weight solution of tetramethylammonium hydroxide (developer solution). After rinsing with pure water, the pattern was evaluated by using SEM (S-4100 manufactured by Hitachi, Ltd.) by observing the line and space pattern at 1.0 to 10.0 μm, and determining the resolution by sensitivity and minimum resolution size (line and space). The result of the pattern evaluation is shown in Table 2.

Examples 2 to 4

A resist solution having different composition was prepared as the procedure of Example 1, and the pattern evaluation was conducted. The compositions are shown in Table 1. The results of the pattern evaluation is shown in Table 2. For Example 3, the puddle development was conducted for 400 seconds, and line and space pattern at 10 to 100 μm was observed.

Reference Example 1

A resist solution was prepared by using the cyclopentanone solution of the polyimide silicone C (solution C1) produced in Synthetic Example 3 and the other component the same as that of Example 2. The pattern evaluation was conducted by using this resist solution. The composition is shown in Table 1. The result of the pattern evaluation is shown in Table 2.

Comparative Example 1

A positive resist solution was prepared by using 12 g of the cyclopentanone solution of the non-acetalized polyimide silicone A (solution A1) produced in Synthetic Example 1 and adding a diazonaphthoquinone as the photosensitizer. More specifically, the other component was the same as that of Example 2 except that 0.8 g of trihydroxybenzophenyl naphthoquinonesulfonate ester (product name "NT-300P" manufactured by Toyo Gosei Co., Ltd.) was added as the diazonaphthoquinone to prepare the resist solution, and the pattern evaluation was conducted by using this resist solution. The composition is shown in Table 1. The result of the pattern evaluation is shown in Table 2.

Comparative Example 2

The experiment of Comparative Example 1 was conducted except using the resist solution containing the solution A2 and the other component shown in Table 1. The result of the pattern evaluation is shown in Table 2. The puddle development was conducted for 600 seconds, and line and space pattern at 10 to 100 μm was observed.

TABLE 1

| | Composition (weight) | | | | |
|---|---|---|---|---|---|
| | Resin solution | Photo-sensitizer | Curing agent 1 | Curing agent 2 | Surfactant |
| Example 1 | solution B1 10 g | Photoacid generator 0.04 g | — | — | 0.008 g |
| Example 2 | solution B1 10 g | Photoacid generator 0.04 g | CL1 0.4 g | CL2 0.4 g | 0.008 g |
| Example 3 | solution B2 11 g | Photoacid generator 0.06 g | CL1 0.6 g | CL2 0.6 g | 0.012 g |
| Example 4 | solution B1 10 g | Photoacid generator 0.04 g | CL1 0.4 g | CL3 0.4 g | 0.008 g |
| Reference Example 1 | solution C1 10 g | Photoacid generator 0.04 g | CL1 0.4 g | CL2 0.4 g | 0.008 g |
| Comparative Example 1 | solution A1 12 g | Photo-sensitizer 0.8 g | CL1 0.4 g | CL2 0.4 g | 0.008 g |
| Comparative Example 2 | solution A2 11 g | Photo-sensitizer 1.2 g | CL1 0.6 g | CL2 0.6 g | 0.012 g |

Photoacid generator: [5-(4-(4-methylphenylsulfonyloxy)-phenylsulfonyloxyimino)-5H-thiophen-2-ylidene]-(2-methylphenyl)-acetonitrile
Photosensitizer: NT-300P (manufactured by Toyo Gosei Co., Ltd.)
CL1: EXA-850CRP (manufactured by DIC Corporation)
CL2: tetramethoxymethylglycoluryl
CL3: 3,3'-methylenebis(2-hydroxy-5-methyl-benzenemethanol)
Surfactant: X-70-093 (manufactured by Shin-Etsu Chemical Co., Ltd.)

TABLE 2

| | Thickness after prebaking (μm) | Sensitivity (mJ) | Thickness after development (μm) | Resolution (μm) |
|---|---|---|---|---|
| Example 1 | 7.0 | 300 | 6.9 | 10.0 |
| Example 2 | 7.4 | 200 | 7.3 | 4.0 |
| Example 3 | 20.3 | 1,200 | 18.3 | 10.0 |
| Example 4 | 7.3 | 250 | 7.0 | 6.0 |
| Reference Example 1 | 7.4 | Dissolution of all surface including the unexposed area | 0.0 | — |
| Comparative Example 1 | 3.2 | 500 | 2.4 | 3.0 |
| Comparative Example 2 | 19.5 | No development of the pattern | 14.6 | — |

Example 5

Solvent resistance was evaluated by using the sample used in Example 2. As in the case of Example 1, a resist film was formed on a silicon wafer (6 inch) by a spinner, and puddle development was conducted for 200 seconds by using a 2.38% by weight solution of tetramethylammonium hydroxide (developer solution). After rinsing with pure water, the sample was heated to 220° C. for 1 hour in an oven in $N_2$ atmosphere to obtain a film having a thickness of 6.7 μm. The wafer having the cured film was immersed in N-methyl-2-pyrrolidone at room temperature for 30 minutes. After rinsing with pure water, the film thickness was measured for comparison with the film thickness before the immersion to determine the proportion of the remaining film to thereby evaluate the solvent resistance. The results are shown in Table 3.

Example 6

The test of Example 5 was conducted by using the sample employed in Example 4. The results are shown in Table 3.

TABLE 3

| | Thickness after hard baking (μm) | Thickness after immersion in NMP (μm) | Proportion of the remaining film (%) |
|---|---|---|---|
| Example 5 | 6.7 | 7.0 | 104 |
| Example 6 | 6.6 | 5.3 | 80 |

As a consequence, it was found that the compositions of Examples 1 to 4 could form a line and space pattern having an aspect ratio of about 2 with good resolution, and the properties were fully acceptable as a photosensitive material. In particular, the resolution was favorable in Example 3 even at a thickness in excess of 20 μm. In Reference Example 1, the film was dissolved in the developer solution even in the non-exposed area due to the insufficient suppression of the development because of the insufficient degree of the acetalization. In Comparative Examples 1 and 2, the pattern could be resolved in the case of a thin film although the proportion of the remaining film was low. However, in the case of a thicker film, the pattern could not be resolved to its bottom due to the high absorption of the light beam by the photosensitizer. In the case of the compositions of Examples 5 and 6 containing the thermal crosslinking agent, the film exhibited good solvent resistance.

Japanese Patent Application No. 2009-058944 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A polyimide silicone having a number average molecular weight of 5,000 to 200,000, which has in the molecule a phenolic hydroxy group in which a part or all of hydrogen atoms are substituted with an acid labile group, said polyimide silicone comprises the repeating unit represented by the following general formula (1):

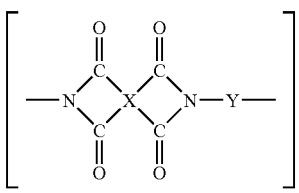
(1)

wherein X is a tetravalent group at least a part of which is a tetravalent organic group represented by the following general formula (2):

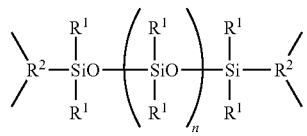
(2)

wherein $R^1$ is independently a monovalent hydrocarbon group of 1 to 8 carbon atoms, $R^2$ is independently a trivalent group, and n is an integer of 1 to 120 on average; and Y is a divalent organic group at least a part of which is a divalent organic group having a phenolic hydroxy group in which a part or all of hydrogen atoms are substituted with an acid labile group represented by the following general formula (3):

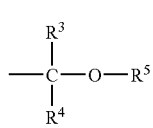
(3)

wherein $R^3$ and $R^4$ are independently a hydrogen atom or a straight, branched, or cyclic alkyl group of 1 to 6 carbon atoms, and $R^5$ is a straight, branched, or cyclic alkyl group of 1 to 30 carbon atoms, an aryl group of 6 to 20 carbon atoms, or an aralkyl group of 7 to 20 carbon atoms. $R^3$ and $R^4$, $R^3$ and $R^5$, or $R^4$ and $R^5$ may be bonded to each other to form a ring together with the carbon atom or the carbon atom and the oxygen atom to which they are bonded with the proviso that the $R^3$, $R^4$, and $R^5$ involved in the formation of the ring are independently a straight or branched alkylene group of 1 to 18 carbon atoms.

2. A polyimide silicone according to claim 1 wherein the divalent organic group Y having a phenolic hydroxy group is a group having a phenolic hydroxy group in which a part or all of hydrogen atoms are substituted with an acid labile group represented by the general formula (3), said divalent organic group Y being represented by the following general formula (4):

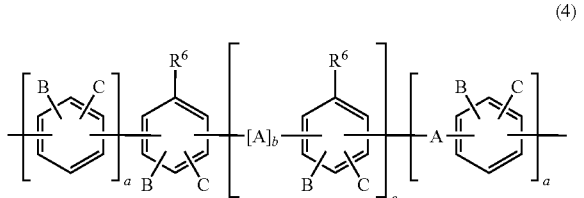
(4)

wherein A is independently a divalent organic group which is any one of the following divalent organic groups:

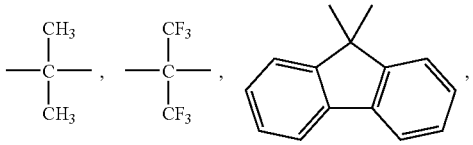

B and C are independently an alkyl group of 1 to 4 carbon atoms or a hydrogen atom, a is 0 or 1, b is 0 or 1, c is an integer of 0 to 10, and $R^6$ is independently a phenolic hydroxy group in which a part or all of hydrogen atoms are substituted with an acid labile group represented by the general formula (3).

3. A polyimide silicone according to claim 1 wherein at least 50% by mole of Y is a group comprising a phenolic hydroxy group in which a part or all of hydrogen atoms are substituted with an acid labile group represented by the general formula (3).

4. A polyimide silicone according to claim 1 wherein the remaining divalent organic groups of Y is at least one member selected from the group consisting of a divalent organic group represented by the following general formula (5):

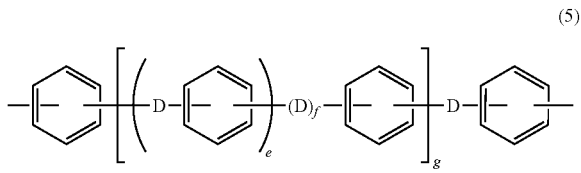
(5)

wherein D is independently any one of the following divalent organic groups

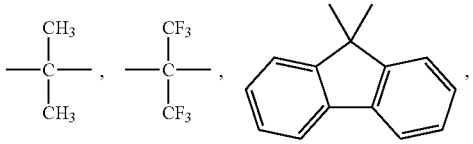

e and f are independently 0 or 1, and g is 0 or 1; and a divalent organic group represented by the following general formula (6):

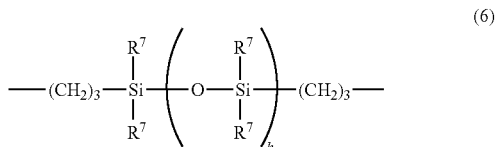
(6)

wherein $R^7$ is independently a monovalent hydrocarbon group of 1 to 8 carbon atoms, h is an integer of 1 to 80.

5. A polyimide silicone according to claim 1 wherein the remaining tetravalent groups of X is a tetravalent group W represented by any one of the following formulae:

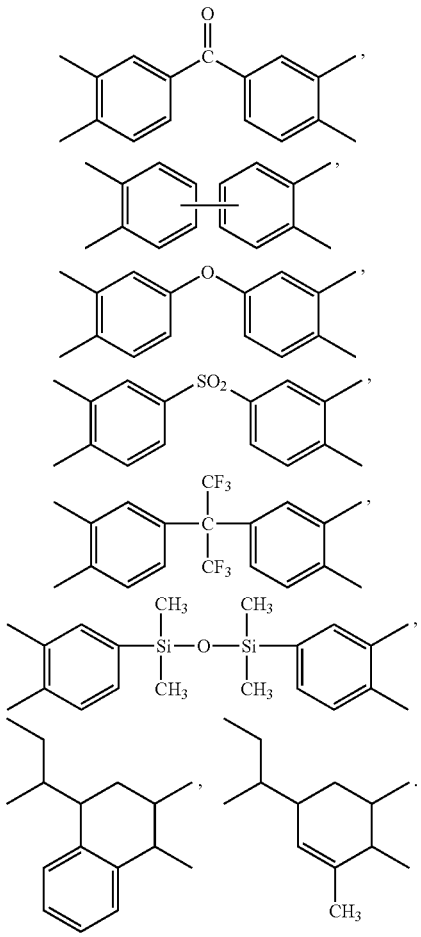

6. A polyimide silicone according to claim 5 which comprises the two repeating units represented by the following general formulae (7):

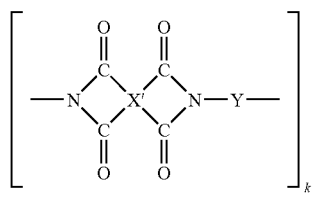

(7)

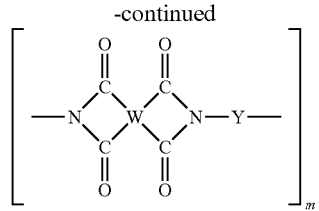

wherein X' is a group represented by the formula (2), Y and W are as defined above, and k and m are independently a positive integer with the proviso that k/(k+m) is at least 0.01.

7. A photosensitive resin composition comprising the polyimide silicone of claim 1 and a photoacid generator which generates an acid by irradiation of a light beam having a wave length in the range of 240 to 450 nm.

8. A photosensitive resin composition comprising
(A) the polyimide silicone of claim 1,
(B) a photoacid generator which generates an acid by irradiation of a light beam having a wave length in the range of 240 to 450 nm, and
(C) a melamine compound, a glycoluril compound, a urea compound, an epoxy compound, or a compound containing at least two methylol derivatives in a molecule.

9. A method for forming a pattern comprising the steps of
(i) forming a layer of the photosensitive resin composition of claim 8 on a substrate,
(ii) exposing the layer of the photosensitive resin composition to a light beam including light having a wavelength of 240 to 450 nm through a photomask, and
(iii) developing the exposed layer of the photosensitive resin composition by using an alkaline developer.

10. A method for forming a pattern comprising the steps of
(i) forming a layer of the photosensitive resin composition of claim 8 on a substrate,
(ii) exposing the layer of the photosensitive resin composition to a light beam including light having a wavelength of 240 to 450 nm through a photomask,
(iii) developing the exposed layer of the photosensitive resin composition by using an alkaline developer, and
(iv) curing the developed layer of the photosensitive resin composition at a temperature in the range of 100 to 250° C.

* * * * *